United States Patent [19]

Wu et al.

[11] Patent Number: 4,710,970

[45] Date of Patent: Dec. 1, 1987

[54] METHOD OF AND APPARATUS FOR GENERATING A FREQUENCY MODULATED ULTRAHIGH FREQUENCY RADIO TRANSMISSION SIGNAL

[75] Inventors: Joseph C. Wu, Saratoga; Yee-Shing Law, Milpitas; John James, Los Gatos, all of Calif.

[73] Assignee: TFT, Inc., Santa Clara, Calif.

[21] Appl. No.: 774,989

[22] Filed: Sep. 11, 1985

[51] Int. Cl.[4] .............................................. H04B 1/04
[52] U.S. Cl. ................................... 455/113; 455/119; 331/23; 332/19
[58] Field of Search ................. 455/42, 110, 112, 113, 455/119, 126; 332/18, 19; 331/18, 23, 25

[56] References Cited

U.S. PATENT DOCUMENTS

| | | | |
|---|---|---|---|
| 3,644,831 | 2/1972 | Latker et al. | 455/113 |
| 4,060,773 | 11/1977 | Hata et al. | 332/19 |
| 4,123,725 | 10/1978 | Davis | 455/119 |
| 4,186,356 | 1/1980 | Remy | 331/23 |
| 4,449,250 | 5/1984 | Kurby | 455/113 |
| 4,610,030 | 9/1986 | Dominguez et al. | 455/113 |

OTHER PUBLICATIONS

Advertising literature published by Moseley Associates, Inc. on Aural Studio-Transmitter Links, 7/84.
Advertising literature published by Moseley Associates, Inc. on Aural Studio-Transmitter Links, 5/77.
Advertising literature published by Micro Controls, Inc. on Studio/Transmitter Link at least as early as May 4, 1984.

Primary Examiner—Jin F. Ng
Attorney, Agent, or Firm—Jack M. Wiseman

[57] ABSTRACT

A UHF transmission frequency oscillator generates a UHF radio signal that is frequency modulated by a program signal. The voltage applied to a control voltage input of the UHF transmission frequency oscillator controls the transmission frequency. A sample of the UHF transmission frequency signal is heterodyned with the output of a crystal controlled reference frequency oscillator to generate a frequency difference signal. A voltage controlled VHF radio signal generator produces a VHF signal frequency modulated by the program signal. A phase detector receives the frequency difference signal and the VHF signal frequency modulated by the program signal and therefrom applies a voltage to the control voltage input of the UHF transmission frequency oscillator for the transmission of a UHF radio frequency signal frequency modulated by the program signal. The VHF voltage controlled generator has VHF programmable frequency dividers, which are pre-settable, to establish the VHF radio transmission frequency. The output of the VHF voltage controlled generator is phase locked through the phase detector with the crystal controlled reference oscillator for the stabilizing of the output transmission frequency of the UHF transmission frequency oscillator.

13 Claims, 10 Drawing Figures

Fig_6

METHOD OF AND APPARATUS FOR GENERATING A FREQUENCY MODULATED ULTRAHIGH FREQUENCY RADIO TRANSMISSION SIGNAL

BACKGROUND OF THE INVENTION

1. Field of the Invention

The present invention relates in general to generating a frequency modulated UHF radio transmission signal, and more particularly to the direct, oscillator generation of a frequency modulated radio transmission signal.

2. Description of the Prior Art

Radio signals in the frequency range of 400 megahertz ("MHz") to 1,000 MHz are used for a variety of purposes, such as fixed, mobile, maritime, aeronautical, and amateur transmissions, for radio and television broadcasting, and for radio navigation. This interval of radio frequencies occupies a portion of a larger interval of frequencies known as the ultrahigh frequencies ("UHF") which extend from 300 MHz to 3,000 MHz.

One of the uses made of radio transmissions in the UHF range is that of linking a studio of a radio station with the station's remote transmitter site, i.e. a studio transmitter link, and for relaying radio broadcasting signals between cities, i.e. an inter-city link. On such a studio transmitter link or an inter-city link, the radio broadcast signals are frequently transmitted as a frequency modulated ("FM") UHF radio signal. Maintaining the quality of a radio broadcast signal during its transmission over a studio transmitter link or an intercity link as a FM UHF signal requires stringent standards on the quality of the transmitted signal and, hence, on the transmitter which generates the signal. Furthermore, improvements in the audio fidelity of radio broadcast signals, such as those occasioned by the recent introduction of optical disk digital recording and reproduction technology, increase the demand for higher quality in the signal transmitted over these links. The prior methods for generating these FM UHF radio signals have been inadequate to satisfy the increasing requirements for high quality transmissions.

One of the previous methods for generating FM UHF radio signals was to generate a FM signal with an oscillator at a frequency significantly lower than the transmission frequency. Such a FM signal was generated at a frequency below 60 MHz. The range of frequencies for the FM signal is known as the very high frequency ("VHF") band. In this example, if a UHF transmission frequency of 960 MHz were desired, then the VHF signal modulated at a frequency of 60 MHz would be multiplied by a factor of 16 to increase the frequency to that desired for the UHF transmission. Because of the frequency multiplication requirement, the quantum of the FM signal with respect to the VHF signal would be a fraction, i.e. 1/16 of the FM signal required for the UHF radio signal.

The preceding frequency multiplying technique for generating FM UHF radio signals presents several problems. Since the FM signal generated by the oscillator is frequency multiplied by a relatively large factor, such as 16, any instability in that signal is also amplified by that same factor. Consequently, the technique for generating UHF radio signals requires stringent standards on the frequency stability of an oscillator generating the VHF signal. Similarly, any noise in the FM signal is also amplified by the multiplying factor. Thus, stringent noise requirements must be met by the oscillator generating the VHF signals. Furthermore, it is difficult to design electronic circuits, such as filters, for adequately performing the necessary frequency multiplication to produce a high quality signal without spurious signals at a UHF radio frequency. Only a relatively ow power signal is produced by frequency multiplication.

The low power signal requires a comparatively large number of power amplifying stages to reach a useful power level for transmitting the FM UHF signal. Finally, it is more costly to design power amplifiers at ultrahigh radio frequencies which have numerous successive amplifying stages, because inter-stage signal coupling tends to make them oscillate uncontrollably.

SUMMARY OF THE INVENTION

An object of the present invention is to provide a method of and apparatus for generating high quality, FM UHF radio transmission signals.

Another object of the present invention is to provide a method of and an apparatus for generating stable, FM UHF radio transmission signals.

Another object of the present invention is to provide a method of and an apparatus for generating low noise, FM UHF radio transmission signals with low harmonic distortion.

Another object of the present invention is to provide a method of and an apparatus for generating higher power, FM UHF radio transmission signals, which require fewer stages of power amplification to reach a useful power level.

Another object of the present invention is to provide a method of and apparatus for generating frequency modulated UHF radio signals in which the transmission frequency is more frequency agile.

Briefly, a UHF transmission frequency oscillator generates a UHF transmission frequency signal frequency modulated by a program signal. The UHF transmission frequency oscillator includes a frequency control voltage input for controlling the UHF transmission frequency generated by the transmission frequency oscillator. A sampling of the output of the transmission frequency oscillator is heterodyned with the output of a reference signal oscillator to produce a difference signal, which is applied to a phase detector. A VHF oscillator generates a VHF signal frequency modulated by the program signal, which is also applied to the phase detector. The phase detector receives the FM VHF signal and the difference signal and therefrom applies a voltage to the frequency control input of the UHF transmission frequency oscillator for the transmission of the UHF signal frequency modulated by the program signal.

A feature of the present invention is that the VHF oscillator has VHF programmable frequency dividers which are pre-settable for establishing the VHF oscillating frequency.

Another feature of the present invention is that the output signal of the VHF oscillator is phase locked with the output signal of the UHF reference oscillator for stabilizing the UHF transmission frequency signal frequency.

Another feature of the present invention is the application of the output voltage of the phase detector to the frequency control input of the UHF transmission frequency oscillator stabilizes the output transmission frequency signal generated by the UHF transmission frequency oscillator while the UHF transmission frequency signal is frequency modulated by the program signal.

DETAILED DESCRIPTION OF THE PREFERRED EMBODIMENT

Figures 1, 2, 3, 4:
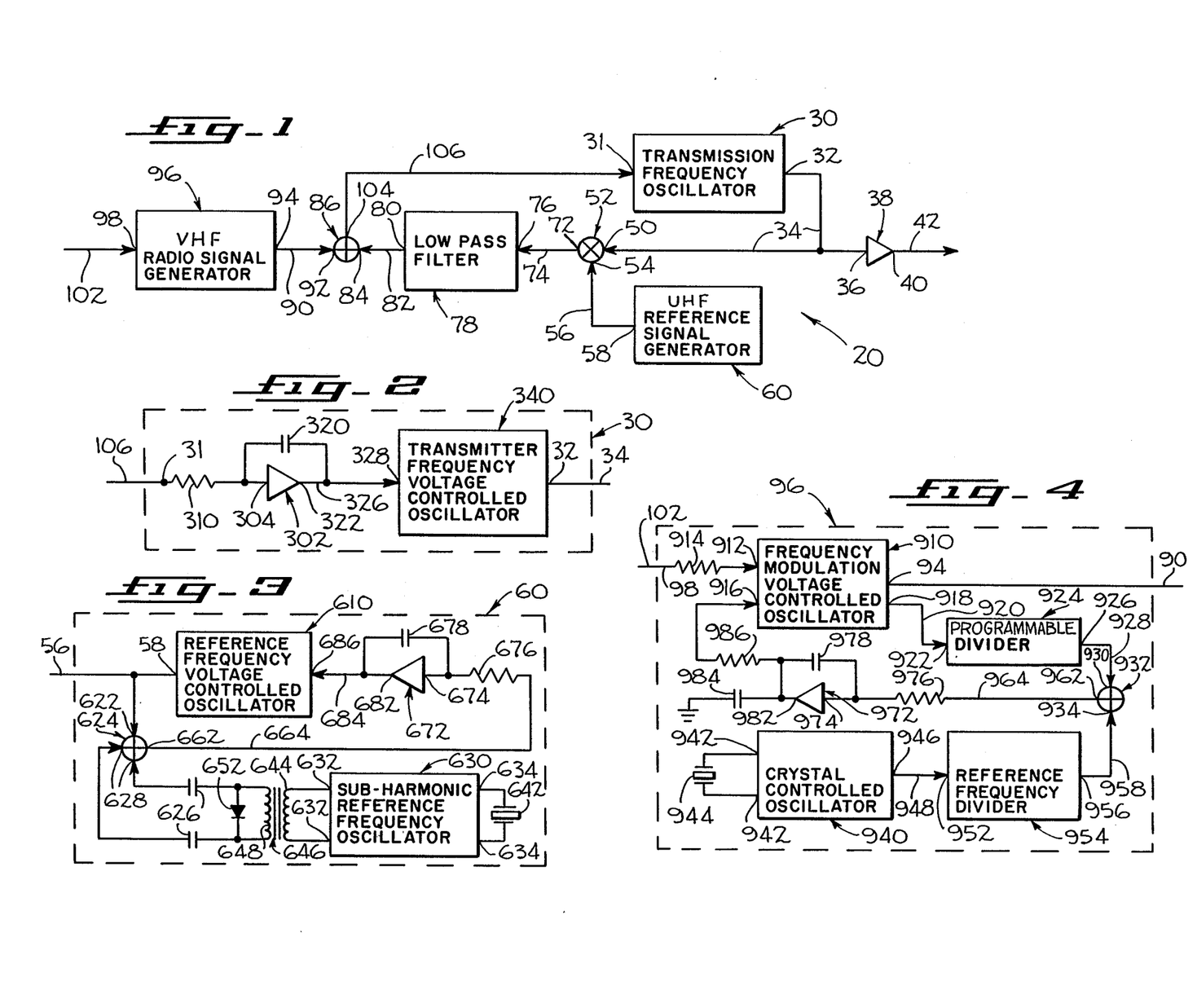
FIG. 1 is a block diagram illustrating a UHF radio frequency transmitter embodying the present invention.
FIG. 2 is a block diagram illustrating the transmission frequency oscillator of the UHF radio frequency transmitter shown in FIG. 1.
FIG. 3 is a block diagram illustrating the UHF reference signal generator of the UHF radio frequency transmitter shown in FIG. 1.
FIG. 4 is a block diagram illustrating the VHF signal generator of the UHF radio frequency transmitter shown in FIG. 1.

Illustrated in FIG. 1 is a UHF radio transmitter 20 embodying the present invention. The UHF radio transmitter 20 generates a UHF radio transmission signal which is frequency modulated by a program signal. The program signal may have base band frequency components extending up to 300 KHz. The UHF radio transmitter 20 includes a transmission frequency oscillator 30 having a frequency control voltage input 31 and an RF output 32. The transmission frequency oscillator 30 generates a UHF radio transmission which, for example, may lie in a frequency range extending from 940 MHz to 960 MHz. Further, the program signal modulation of the UHF radio transmission signal causes that signal to be frequency modulated throughout a frequency deviation which, for example, may be in the neighborhood of 50 to 200 KHz wide. The output 32 of the transmission frequency oscillator 30 applies the UHF radio transmission signal, to a line 34 over which a signal is transmitted to an input 36 of a UHF power amplifier 38. The UHF power amplifier 38 increases the power of the UHF radio transmission signal and transmits the amplified UHF radio transmission signal from an output 40 to a line 42. From the line 42, the signal is transmitted by way of an antenna (not shown).

In addition, a sample of the UHF radio transmission signal generated by the transmission frequency oscillator 30 is conducted over the line 34 to an input 50 of a conventional and well-known mixer 52. A UHF reference frequency signal, such as a 886.5 MHz signal, is applied to an input 54 of the mixer 52 over a conductor 56 from the output 58 of a UHF reference frequency generator 60. The UHF radio transmission signal and the UHF reference signal are heterodyned in the mixer 52 to generate sum and difference signals. One of the signals thus generated is a frequency difference signal having a frequency equal to the difference between that of the frequency of the UHF radio transmission signal and the frequency of the UHF reference signal. In the exemplary embodiment, the frequency difference signal will lie in a frequency range extending from 60 to 80 MHz.

The sum and difference signals of the mixer 52 are transmitted from the output 72 over line 74 to the input 76 of a low pass filter 78. The low pass filter 78 passes the frequency difference signal and applies the frequency difference signal from the output 80 to a conventional and well-known phase detector 86. In the exemplary embodiment, the low pass filter 78 attenuates all signals in the sum and differnce signals having frequency components greater than 80 MHz and passes all difference signals having frequency components less than 80 MHz The frequency difference signal present at the output 80 of the low pass filter 78 is transmitted over a line 82 to the frequency difference signal input 84 of the phase detector 86.

A VHF radio frequency generator 96 has its output 94 connected to an input 92 of the phase detector 86. The output frequency of the VHF radio frequency generator 96 is frequency modulated by the program signal sent over the conductor 102 and applied to the input 98 of the VHF radio frequency generator 96. The phase detector 86 receives the frequency modulated VHF radio signal generated by the VHF radio signal generator 96 and the difference signal applied thereto by the low pass filter 78. The phase detector 86 thereupon generates a transmission frequency control voltage. The transmission frequency control voltage is applied from the output 104 over a line 106 to the transmission frequency control voltage input 31 of the transmission frequency oscillator 30.

A phase locked loop for stabilizing the UHF radio transmission signal transmitted by the UHF transmitter 20 includes the transmission frequency oscillator 30, the UHF reference generator 60, the mixer 52, the low pass filter 78, and the phase detector 86. The phase locked loop causes the frequency of the UHF radio transmission signal to equal the sum of the frequency of the UHF reference signal and the frequency of the VHF radio signal. Consequently, the frequency of the UHF radio transmission signal generated by the transmission frequency oscillator 30 is stabilized and simultaneously is frequency modulated by the program signal.

Changes in the transmission frequency of the UHF radio transmission signal produced by the transmission frequency oscillator 30 throughout the 20 MHz range may be obtained by changing the frequency of the VHF radio signal. Such changes are accommodated by the low pass filter 78. Changes in the transmission frequency which exceed the 20 MHz range require changing the frequency of the UHF reference signal but do not require replacing the low pass filter 78. While the UHF transmitter 20 is particularly adapted for use in the frequency range extending from 940 to 960 MHz, the UHF transmitter 20 of the present invention may be adapted, and is economically practical, for use at any frequency lying within a 20 MHz wide frequency band which may be arbitrarily located about any selected frequency in a range extending from 400 MHz to frequencies above 1,000 MHz merely by appropriately selecting the respective frequencies for the UHF reference frequency signal and the VHF radio signal.

Referring now to FIG. 2, the transmission frequency oscillator 30 includes a phase locked loop error amplifier 302. The phase locked loop error amplifier 302 has an input 304 to which the transmission frequency control voltage is applied through a resistor 310. The transmitter frequency error amplifier 302 includes a feedback capacitor 320 coupled between the output 322 of the transmitter frequency error amplifier 302 and the input 304 of the transmitter frequency error amplifier 302. The resistor 310 and the feedback capacitor 320 cause the transmitter frequency error amplifier 302 to operate as a low pass filter, thus amplifying only lower frequency components in the transmission frequency control voltage while attenuating its higher frequency components.

From the output 322 of the transmitter frequency error amplifier 302, the amplified lower frequency components of the transmission frequency control signal are applied over a line 326 to the input 328 of a voltage controlled oscillating device 340. The voltage controlled oscillating device 340 produces a UHF radio transmission signal. The UHF radio transmission signal is present at the output 32 of the transmission frequency oscillator 30. The amplified transmission frequency control voltage applied to the input 31 of the transmission frequency oscillator 30 controls the frequency of the UHF radio transmission signal produced by the voltage controlled oscillating device 340.

Referring now to FIG. 3, the UHF reference signal generator 60 includes a reference frequency voltage controlled oscillator 610. The output of the reference frequency voltage controlled oscillator 610 is transmitted over the line 56 to the mixer 52. A sample of the UHF reference signal produced by the reference frequency voltage controlled oscillator 610 is supplied over the line 56 to the input 622 of a balanced reference frequency phase comparator 624. A crystal controlled UHF reference signal is also applied through capacitors 626 to inputs 628 of the reference frequency phase comparator 624.

The crystal controlled UHF reference signal applied to the reference frequency phase comparator 624 is generated by a sub-harmonic reference frequency oscillator 630 having outputs 632 and inputs 634. A sub-harmonic reference frequency crystal is connected between the inputs 634. The sub-harmonic reference frequency crystal 642 causes the sub-harmonic reference frequency oscillator 630 to generate a crystal controlled sub-harmonic reference frequency signal at the sub-harmonic frequencies of the reference frequency voltage controlled oscillator 610. The crystal controlled sub-harmonic reference frequency signal is transmitted from the outputs 632 of the sub-harmonic reference frequency oscillator 630 to a primary winding 644 of a toroidal transformer 646. The capacitors 626 are respectively connected to opposite ends of the secondary winding 648 of the transformer 646. A step recovery diode 652 connected across the secondary winding 648 of the transformer 646 creates an harmonic frequency. Thus, the crystal controlled UHF reference signal applied through the capacitors 626 to the inputs 628 of the reference frequency phase comparator 624 includes the harmonic frequencies of the sub-harmonic reference frequency oscillator 630.

The reference frequency phase comparator 624 compares the higher harmonic frequencies of the crystal controlled sub-harmonic reference frequency oscillating signal applied to the inputs 628 with that of the UHF reference frequency signal from the voltage controlled oscillator 610 to produce a reference frequency control signal proportional to the phase difference between the frequencies of the two signals. The reference frequency control signal present at output 662 of the reference frequency phase comparator 624 is conducted over a line 664. The line 664 conducts the reference frequency control signal to a phase error amplifier 672. The phase error amplifier includes an input 674 to which the reference frequency control signal is applied through a resistor 676. The reference frequency error amplifier 672 includes a feedback capacitor 678 coupled between an output 682 of the phase error amplifier 672 and the input 674. The resistor 676 and the feedback capacitor 678 cause the phase error amplifier 672 to operate as a low pass filter, thus amplifying only lower frequency components in the reference frequency control signal while attenuating its higher frequency components. Thus, only the DC and the lower frequency components in the reference frequency control signal applied to the resistor 676 are amplified by the phase error amplifier 672 and are coupled to the output 682.

From the output 682 of the phase error amplifier 672, the amplified lower frequency components of the reference frequency control signal are coupled over a line 684 to an input 686 of the reference frequency voltage controlled oscillator 610. The voltage output of the phase error amplifier 672 determines the frequency of the UHF reference signal generated by the reference frequency voltage controlled oscillator 610. Thus, the UHF reference signal generator 60 incorporates the reference frequency voltage controlled oscillator 610 into the phase locked loop. The phase locked loop urges the frequency of the UHF reference signal to equal that of one of the harmonics of the crystal controlled UHF reference signal applied to the reference frequency phase comparator 624. Consequently, the crystal controlled UHF reference signal applied to the reference frequency phase comparator 624 causes the UHF reference signal generator 60 to produce a frequency stable UHF reference signal at a multiple of the crystal oscillator 630.

Referring now to FIG. 4, the VHF radio signal generator 96 includes a frequency modulation voltage controlled oscillator 910. The frequency modulation voltage controlled oscillator 910 includes an input 912 to which the program signal is applied through a resistor 914. The frequency modulation voltage controlled oscillator 910 also includes a direct current control voltage input 916 and a VHF radio signal output 94. The VHF radio signal is transmitted from the output 94 over the line 90 to the phase detector 86. A sample of the VHF radio signal produced by the frequency modulation voltage controlled oscillator 910 is supplied from the output 918 thereof over a line 920 to the input 922 of a programmable VHF signal divider 924. The programmable VHF signal divider 924 reduces the frequency of the VHF radio signal to an integral sub-frequency signal thereof. The integral sub-frequency signal is transmitted from the output 926 of the signal divider 924 over a line 928 to an input 930 of a phase comparator 932. An integral reference sub-frequency signal is also supplied to an input 934 of the phase comparator 932.

The integral reference sub-frequency signal applied to the input 934 of the frequency modulation phase comparator 932 is obtained by generating a reference frequency signal through crystal controlled oscillator 940. The crystal controlled oscillator 940 includes inputs 942 across which a VHF crystal 944 is connected. The VHF reference frequency crystal 944 causes the crystal controlled oscillator 940 to generate a stable frequency modulation reference frequency signal which may be at a frequency such as 5.0 MHz. The reference frequency signal is transmitted from an output 946 of the crystal controlled oscillator 940 over a line 948 to an input 952 of a reference frequency divider 954. The reference frequency divider 954 reduces the frequency of the reference frequency signal by dividing it by a second constant divisor to produce the integral reference sub-frequency signal. The integral reference sub-frequency signal thus produced is transmitted from an output 956 of the reference frequency divider 954 over a line 958 to the input 934 of the phase comparator 932.

The phase comparator 932 compares the frequency of the integral sub-frequency input signal applied to the input 930 with the integral reference sub-frequency signal applied to the input 934 to produce a control signal proportional to the difference between the frequencies of the integral sub-frequency and the integral reference sub-frequency signals. The control signal present at the output 962 of the phase comparator 932 is applied to a line 964. The line 964 conducts the direct current control voltage to a reference frequency error amplifier 972. The reference frequency amplifier 972 includes input 974 to which the frequency modulation control signal is applied through a resistor 976. The reference frequency error amplifier 972 includes a feedback capacitor 978 coupled between the output 982 and the input 974 of the reference frequency error amplifier 972. The resistor 976 and the feedback capacitor 978 cause the reference frequency error amplifier 972 to operate as a low pass filter. Thus, the lower frequency components in the frequency modulation control signal are amplified and the higher frequency components are attenuated. Hence, the lower frequency components in the frequency modulation control signal applied to the input resistor 976 are amplified by the reference frequency error amplifier 972 and are coupled to the output 982.

From the output 982 of the reference frequency error amplifier 972, the amplified lower frequency components of the frequency modulation control signal are applied to one side of a bypass capacitor 984 and to one terminal of a coupling resistor 986. The other side of the bypass capacitor 984 is connected to ground. The other side of the coupling resistor 986 is connected to the input 916 of the frequency modulation voltage controlled oscillator 910. Thus, the coupling resistor 986 supplies a sample of the amplified direct current control voltage to the input 916 of the frequency modulation voltage controlled oscillator 910. The direct current control voltage determines the center frequency about which the VHF radio signal is frequency modulated by the program signal. Thus, the VHF radio signal generator 96 incorporates the frequency modulation voltage controlled oscillator 910 into a phase locked loop for controlling the frequency of the VHF radio signal.

The phase locked loop incorporating the frequency modulation voltage controlled oscillator 910 urges the frequency of the integral sub-frequency signal to equal that of the integral reference sub-frequency signal applied to the input 934 of the phase comparator 932. Depending upon whether the UHF radio transmission signal is to be frequency modulated about the specified transmission frequency throughout a frequency interval in the neighborhood of 50 KHz to 200 KHz increments, the value of the reference frequency divider 954 is appropriately pre-set to produce an integral reference sub-frequency signal having a frequency of 500 to 2000 Hz. Because the frequency modulation voltage controlled oscillator 910 is incorporated into a phase locked loop and because the VHF radio signal which it generates is divided by the programmable divisor in the divider 924 to produce the integral sub-frequency signal, the direct current control voltage urges the frequency of the VHF radio signal to equal the frequency of the integral reference sub-frequency signal as selected by the value of the programmable divisor. Thus, by appropriately pre-setting the value of the programmable divisor, the frequency of the VHF radio signal may be established at any frequency throughout the frequency range, for example from 60 to 80 MHz, as is required to produce the UHF radio transmission signal at a desired transmission frequency lying within the 20 MHz frequency band extending from 940 to 960 MHz.

Figures 5, 7:
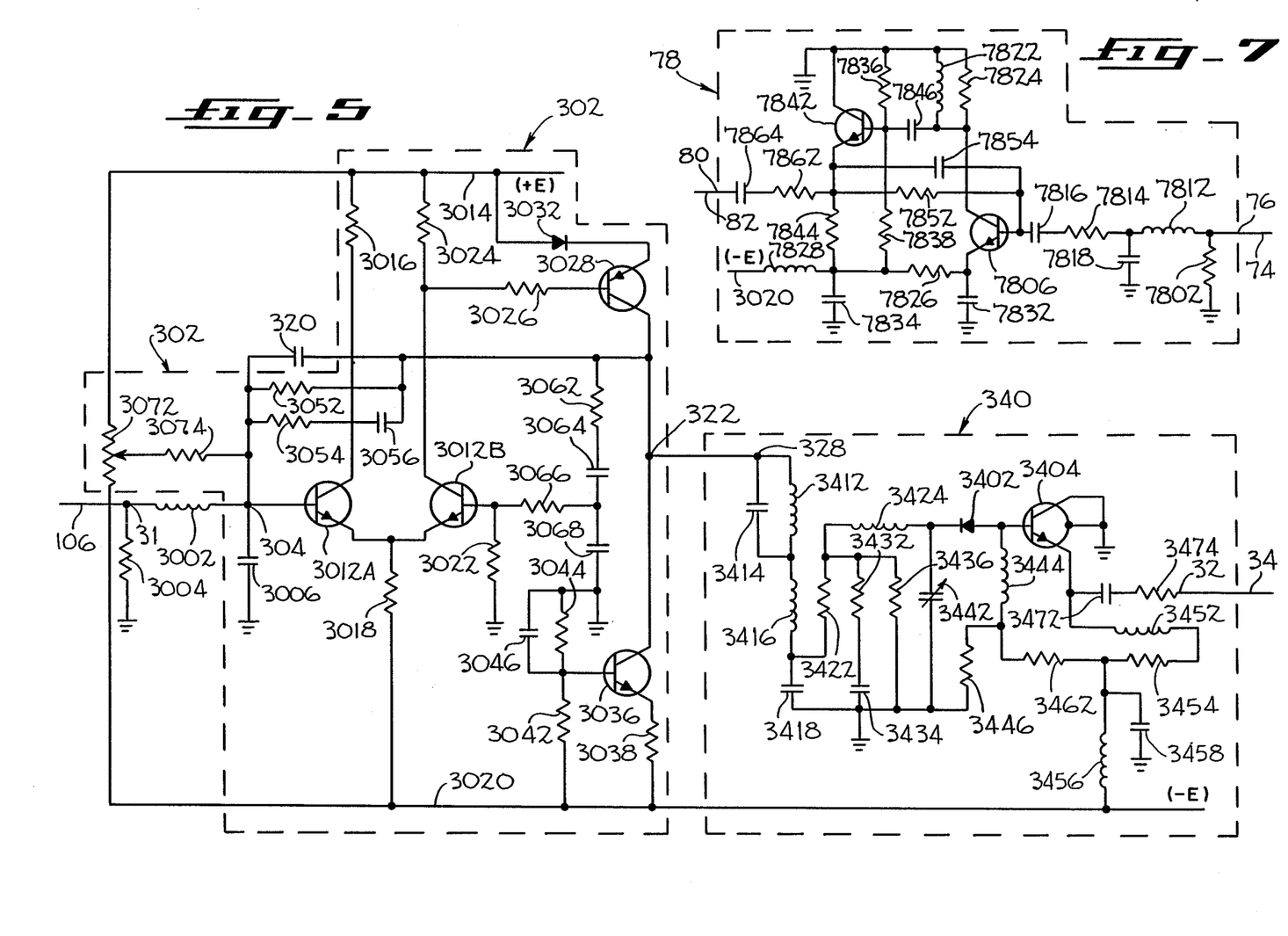
FIG. 5 is a circuit diagram illustrating the transmission frequency oscillator shown in FIG. 2.
FIG. 7 is a circuit diagram illustrating a low pass filter of the UHF radio frequency transmitter shown in FIG. 1.

Referring now to FIG. 5, the input 304 of the transmitter frequency error amplifier 302 receives the transmission frequency control signal from the output 104 of the phase detector 86 through an inductor 3002. A resistor 3004 is connected between ground and one side of the inductor 3002 at the input 31 of the transmission frequency oscillator 30. A capacitor 3006 is connected between ground and the other side of the inductor 3002 at the input 304 of the transmitter frequency error amplifier 302. The inductor 3002 and the capacitor 3006 attenuate the higher frequency components in the transmission frequency control signal applied to the input 304 according to the magnitude thereof at the input 31.

The signal present at the input 304 of the transmitter frequency error amplifier 302 is applied directly to the base of an NPN transistor 3012A. Current is supplied from a positive supply voltage (+E) present on a positive supply voltage line 3014 to the collector of the transistor 3012A through a resistor 3016. The emitters of the NPN transistors 3012A and 3012B are joined to establish a differential amplifier. A resistor 3018 connects the common emitters of the transistors 3012A and 3012B to a negative supply voltage (−E) present on a line 3020, thus providing a sink for current flowing from the emitters of the transistors 3012A and 3012B. A reference voltage is applied to the base of the transistor 3012B by a resistor 3022.

The positive supply voltage (+E) is applied to the transistor 3012B through a resistor 3024 connected between the collector and the positive supply voltage line 3014. The collector of the transistor 3012B is also connected through a resistor 3026 to the base of a PNP transistor 3028. The emitter of the transistor 3028 is connected to the cathode of a diode 3032. The anode of the diode 3032 is connected to the positive supply voltage line 3014. The collector of the transistor 3028, which is the output 322 of the transmitter frequency error amplifier 302, is connected to the collector of an NPN transistor 3036.

Current flow from the transistor 3036 to the negative supply voltage (−E) is through a resistor 3038, which is connected between the emitter and the negative supply voltage line 3020. A resistor 3042 and a resistor 3044 connected in series between the negative supply voltage line 3020 and ground provide a voltage divider. The junction of the resistor 3042 with the resistor 3044 is connected to the base of the transistor 3036. A capacitor 3046 is connected in parallel with the resistor 3044. The resistor 3042, the resistor 3044 and the capacitor 3046 provide a filtered, constant reference voltage to the base of the transistor 3036. Thus, the transistor 3036 and the resistor 3038 operate as a high impedance, constant current sink which receives current from the collector of the transistor 3028.

The amplification of the differential amplifier transistors 3012A and 3012B and further amplification by the transistor 3028 produce a signal at the output 322 of the transmitter frequency error amplifier 302 which is the amplified complement of the signal present at the input 304 of the frequency error amplifier 302. Thus, a resistor 3052 connected between the output 322 and the input 304 of the transmitter frequency error amplifier 302 provides a negative feedback signal to the base of the transistor 3012A for reducing the overall gain of the transmitter frequency error amplifier 302 and for stabilizing the direct current voltage component in the signal present at the output 322. The feedback capacitor 320 connected between the output 322 and the input 304 in parallel with the resistor 3052, provides additional negative feedback of higher frequency components present in the signal at the output 322 of the transmitter frequency error amplifier 302. Thus, the feedback capacitor 320 causes the transmitter frequency error amplifier 302 to operate as a low pass filter providing lesser amplification for the higher frequency components in the transmission frequency control signal.

The transmitter frequency error amplifier 302 also includes a negative feedback network between its error amplifier output 322 and the error amplifier input 304 comprising a series connected resistor 3054 and a capacitor 3056 which are connected in parallel with the feedback capacitor 320 and the resistor 3052. The transmitter frequency error amplifier 302 also includes a positive feedback network between the output 322 and the base of the transistor 3012B. The positive feedback network comprises a resistor 3062, a capacitor 3064, and a resistor 3066 connected in series between the output 322 and the base of the transistor 3012B. A capacitor 3068 is connected between ground and the junction of the capacitor 3064 with the resistor 3066. If the phase locked loop of the UHF radio transmitter 20 becomes unlocked, then the negative feedback provided by the series connected resistor 3054 and capacitor 3056 and the positive feedback provided by the resistor 3062, capacitor 3064, resistor 3066, and capacitor 3068 will successively sweep the signal present at the output 322 from the negative supply voltage (−E) to the positive supply voltage (+E) until the loop once again becomes locked. A potentiometer 3072 connected between the positive supply voltage (+E) and the negative supply voltage (−E) provides an adjustable voltage source for applying a constant reference potential to the input 304 of the transmitter frequency error amplifier 302 through a resistor 3074. Adjusting the potential applied by the potentiometer 3072 to the resistor 3074 controls the symmetry of the sweep signal produced by the transmitter frequency error amplifier 302 if the phase locked loop becomes unlocked.

The signal present at the output 322 of the feedback capacitor 320, whether it is the amplified transmission frequency control signal when the phase locked loop of the UHF transmitter 20 is locked or the swept voltage signal generated by the transmitter frequency error amplifier 302 when the loop is unlocked, is transmitted over the amplified error signal line 326 to the input 328 of the transmitter frequency voltage controlled oscillator 340. A portion of the signal present at the input 328 of the transmitter frequency voltage controlled oscillator 340 is applied through an isolation network to a varicap 3402 of a tuned circuit connected to an NPN transistor 3404.

The isolation network between the input 328 and the varicap 3402 includes a parallel inductor 3412 and capacitor 3414 connected to the input 328, to an inductor 3416 and to a capacitor 3418 of the voltage controlled oscillator 340. The isolation network further includes a resistor 3422 and an inductor 3424 connected in series between the junction of the inductor 3416 with the capacitor 3418 and the cathode of the varicap 3402. A series connected resistor 3432 and capacitor 3434 are connected in parallel by a resistor 3436.

In addition to the varicap 3402, the tuned circuit includes an adjustable capacitor 3442 connected to ground from the junction between the inductor 3424 and the cathode of the varicap 3402. A series connected inductor 3444 and resistor 3446 are connected between the anode of the varicap 3402 and circuit ground. The connection of the anode of the varicap 3402 to the base of the transistor 3404 establishes a parallel resonant circuit at the base of the transistor 3404. A change in the capacitance of the varicap 3402 induced by a change in the voltage applied to the input 328 of the transmitter frequency voltage controlled oscillator 340 changes the resonant frequency of the tuned circuit located at the base of the transistor 3404.

Current flows from the emitter of the transistor 3404 through a series connected inductor 3452, resistor 3454, and inductor 3456 to the negative supply voltage (−E) on the line 3020. A capacitor 3458 connected between the junction of the resistor 3454 with the inductor 3456 and circuit ground establishes a series resonant circuit in the collector of the transistor 3404. A resistor 3462 connected between the junction of the resistor 3454 with the inductor 3456 and the junction of the inductor 3444 with the resistor 3446 applies a direct current bias to the resonant circuit and to the isolation network coupled to the base of the transistor 3404 and also couples thereto a sample of the signal present in the resonant circuit located in the collector of the transistor 3404. A series connected capacitor 3472 and resistor 3474 couples the UHF radio transmission signal present at the emitter of the transistor 3404 to the output 32 of the transmission frequency oscillator 30 for transmission to the power amplifier 38 and to the mixer 52.

Figure 6:
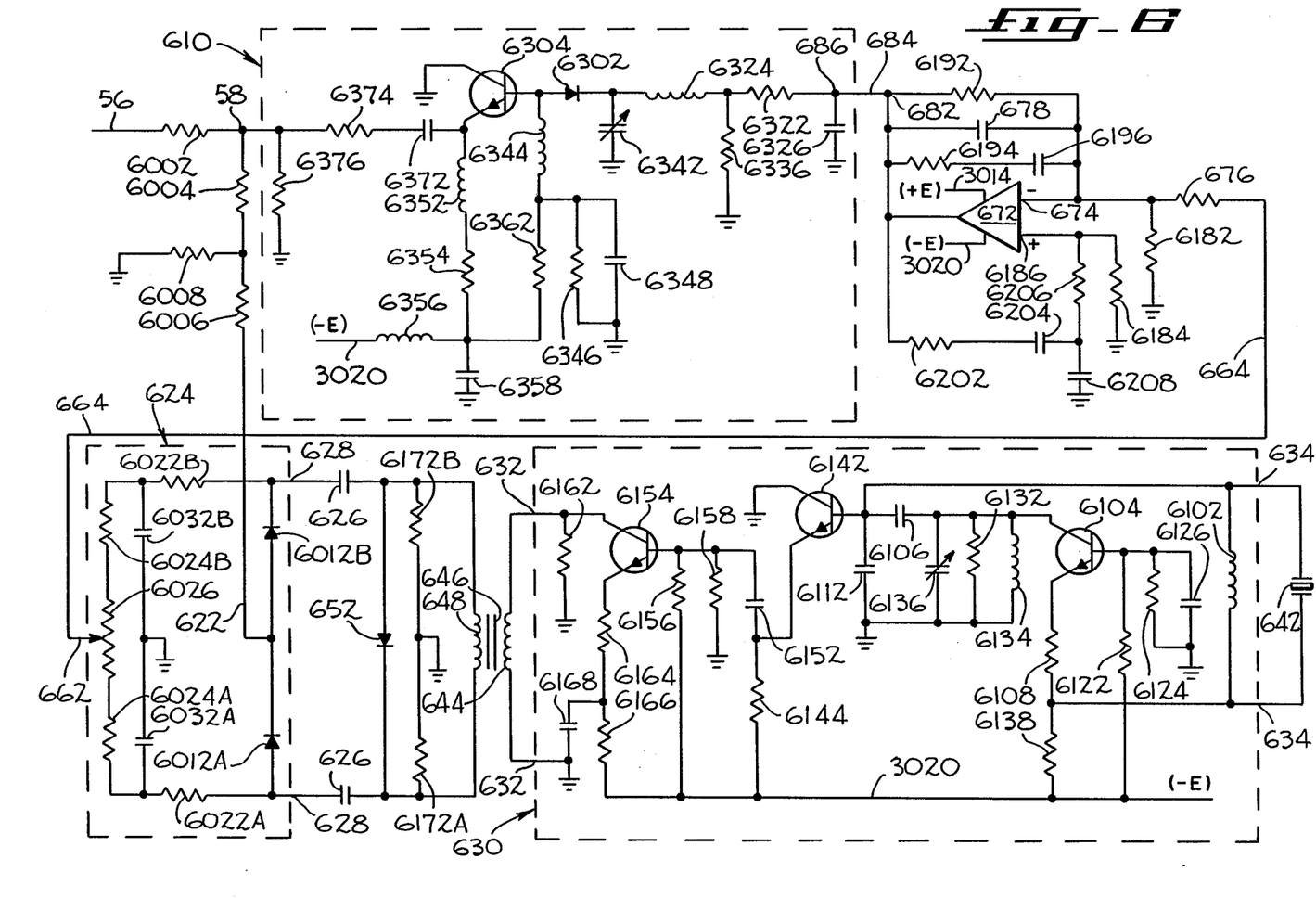
FIG. 6 is a circuit diagram illustrating the UHF reference signal generator shown in FIG. 3.

Referring now to FIG. 6, a sample of the UHF reference signal generated by the reference frequency voltage controlled oscillator 610 is transmitted from the output 58 through a resistor 6002 to the line 56. The remainder of the UHF reference signal generated by the reference frequency voltage controlled oscillator 610 is transmitted through series connected resistors 6004 and 6006 to the input 622 of the reference frequency phase comparator 624. The junction between the resistor 6004 and the resistor 6006 is connected to ground by a resistor 6008 to provide a reference signal for the balanced reference frequency phase comparator 624.

The UHF reference signal is applied to the junction of diodes 6012A and 6012B. The UHF reference signal is coupled through the capacitor 626 to inputs 628 of the reference frequency phase comparator 624 and is applied across the diodes 6012A and 6012B. The reference frequency phase comparator 624 includes a resistive load comprising resistor 6022A, resistor 6024A, potentiometer 6026, resistor 6024B, and resistor 6022B. Bypass capacitors 6032A and 6032B are respectively connected between ground and the junction between the resistor 6022A or 6022B and the resistor 6024A or 6024B. If a difference exists between the frequencies or phase of the UHF reference signal and the crystal controlled UHF reference signal applied to the reference frequency phase comparator 624, a direct current signal appears across the resistive load comprising the resistors 6022A, 6022B, 6024A, 6024B, and the potentiometer 6026.

The crystal controlled sub-harmonic reference frequency signal, which is frequency multiplied to produce the crystal controlled UHF reference signal, is generated by the sub-harmonic reference frequency oscillator 630. The sub-harmonic reference frequency oscillator 630 includes an inductor 6102 connected between the inputs 634 in parallel with the sub-harmonic reference frequency crystal 642. The opposite terminals of the crystal 642 and inductor 6102 are respectively coupled to the collector of an NPN transistor 6104 through a coupling capacitor 6106 and to the emitter of the transistor 6104 through a resistor 6108. A capacitor 6112 is connected between circuit ground and the junction of the parallel connected crystal 642 and inductor 6102. The coupling of the crystal 642 and inductor 6102 to the transistor 6104 applies a sample of the signal present at the collector of the transistor 6104 to its emitter through the parallel resonant circuit of the crystal 642 and the inductor 6102.

A voltage divider is provided by a resistor 6122 and a resistor 6124 connected in series between the negative supply voltage line 3020 and ground. The junction of the resistor 6122 with the resistor 6124 is connected to the base of the transistor 6104. A capacitor 6126 is connected in parallel with the resistor 6124 between ground and the junction of the resistor 6122 with the resistor 6124 and the base of the transistor 6104. The resistor 6122 and resistor 6124 together with the capacitor 6126 provide a filtered, constant reference voltage to the base of the transistor 6104. Current is supplied to the transistor 6104 through a resistor 6132 and an inductor 6134 connected between its collector and ground. The inductor 6134 and an adjustable capacitor 6136 connected in parallel with the resistor 6132 establish a tunable, parallel resonant circuit located at the collector of the transistor 6104. Current flows from the emitter of the transistor 6104 through the resistor 6108 and a series connected resistor 6138 to the negative supply voltage ($-E$) present on the line 3020. Thus, the transistor 6104, in conjunction with both the resonant circuit connected between its collector and ground and the resonant circuit between its collector and its emitter, operates as a crystal controlled oscillator for generating the crystal controlled sub-harmonic reference frequency signal.

A sample of the crystal controlled sub-harmonic reference frequency signal present at the collector of the transistor 6104 is also applied through the coupling capacitor 6106 to the base of an NPN transistor 6142. A bias voltage is applied to the base of the transistor 6142 through the inductor 6102 from the junction between the resistor 6108 and the resistor 6138. The transistor 6142 operates as an emitter follower increasing the power of the crystal controlled sub-harmonic reference frequency signal.

The crystal controlled sub-harmonic reference frequency signal present at the junction of the resistor 6144 and the emitter of the transmitter 6142 is applied through a coupling capacitor 6152 to the base of an NPN transistor 6154. From the collector of the transistor 6154, the sub-harmonic reference frequency signal is applied to the primary winding 644 of the toroidal transformer 646. A voltage divider is provided by a resistor 6154 and a resistor 6158 connected in series between the negative supply voltage line 3020 and ground. The junction of the resistor 6156 with the resistor 6158 is connected to the base of the transistor 6154 to provide a reference voltage thereto. Current flows through the primary winding 644 of the transformer 646 from the collector of the transistor 6154 and current flows from the sub-harmonic reference frequency oscillator 630 to the transistor 6154 through a resistor 6162. Current flows from the emitter of the transistor 6154 through series connected resistors 6164 and 6166 to the negative supply voltage ($-E$) present on the negative supply voltage line 3020. A bypass capacitor 6168, connected from ground to the junction between the resistor 6164 and the resistor 6166, impedes the coupling of the crystal controlled sub-harmonic reference frequency signal to the negative supply voltage line 3020 and its consequent imposition on the negative supply voltage ($-E$). Thus, the transistor 6154 amplifies the crystal controlled sub-harmonic reference frequency signal present at its base and applies the amplified signal to the primary winding 644 of the transformer 646.

The crystal controlled sub-harmonic reference frequency signal generated by the sub-harmonic reference frequency oscillator 630 is applied across the primary winding 644 of the transformer 646. Connected across the secondary winding 648 of the transformer 646 are a pair of series connected resistors 6172A and 6172B having their common junction connected to ground. The step recovery diode 652, connected across the resistors 6172A and 6172B and the secondary winding 648 of the transformer 646, multiplies the frequency of the crystal controlled sub-harmonic reference frequency signal by a factor of ten (10) to produce the crystal controlled UHF reference signal. The UHF reference signal thus produced is applied through the capacitors 626 to the inputs 628 of the reference frequency phase comparator 624.

If a difference exists between the frequencies or phase of the UHF reference frequency signal and the crystal controlled UHF reference frequency signal applied to the reference frequency phase comparator 624, a direct current signal appears across the resistive load consisting of the resistors 6022A, 6022B, 6024A, 6024B, and the potentiometer 6026. This signal is transmitted through the output 662 of the reference frequency phase comparator 624 via the line 664 to one side of the input resistor 676. The other side of the resistor 676 is connected to the differential, inverting ($-$) input 674 of the reference frequency error amplifier 672 which is preferably one of a pair of amplifiers included in a single type LF353 integrated circuit. A resistor 6182 is connected between the inverting ($-$) input 674 and ground. Similarly, a resistor 6184 is connected between ground and a differential, non-inverting ($+$) input 6186, thus establishing a reference voltage for the reference frequency error amplifier 672. Both the positive supply voltage ($+E$) present on the line 3014 and the negative supply voltage ($-E$) present on the line 3020 are also applied to the reference frequency error amplifier 672.

The amplification provided by the differential reference frequency error amplifier 672 produces a signal at the output 682 of the reference frequency error amplifier 672 which is the amplified complement of the signal present at the inverting ($-$) input 674. Thus, a resistor 6192 connected between the error amplifier output 682 and the inverting ($-$) input 674 of the reference frequency error amplifier 672 provides a negative feedback signal to the inverting ($-$) input 674 for reducing the overall gain of the reference frequency error amplifier 672 and for stabilizing the direct current voltage component in the signal present at the output 682. The feedback capacitor 678, connected between the output 682 and the inverting (−) input 674 in parallel with the resistor 6192, provides additional negative feedback of higher frequency components present in the signal at the output 682 of the reference frequency error amplifier 672. Thus, the feedback capacitor 678 causes the reference frequency error amplifier 672 to operate as a low pass filter providing lesser amplification for the higher frequency components in the reference frequency control signal.

The reference frequency error amplifier 672 includes another negative feedback network connected between the 682 and the input 674. The negative feedback network includes a series connected resistor 6194 and capacitor 6196 which parallel both the feedback capacitor 678 and the resistor 6192. The reference frequency error amplifier 672 has a positive feedback network connected between the output 682 and the input 6186. The positive feedback network includes a resistor 6202, a capacitor 6204, and a resistor 6206 connected in series between the output 682 and the input 6186.

A capacitor 6208 is connected between ground and the junction of the capacitor 6204 with the resistor 6206. If the phase locked loop controlling the frequency of the UHF reference signal generated by the UHF reference signal generator 60 becomes unlocked then the negative feedback provided by the series connected resistor 6194 and capacitor 6196 in combination with the positive feedback provided by the resistor 6202, capacitor 6204, resistor 6206, and capacitor 6208 will successively sweep the signal present at the output 682 from the negative supply voltage (−E) to the positive supply voltage (+E) until the loop once again becomes locked.

The signal present at the output 682 of the reference frequency error amplifier 672, whether it is the amplified reference frequency control signal when the phase locked loop of the UHF reference signal generator 60 is locked or the swept voltage signal generated by the reference frequency error amplifier 672 when the loop is unlocked, is transmitted over the line 684 to the input 686 of the reference frequency voltage-controlled oscillator 610. A sample of the signal present at the input 686 of the reference frequency voltage controlled oscillator is applied through an isolation network to a varicap 6302 included in a tuned circuit connected to an NPN transistor 6304. The isolation network between the input 686 and the varicap 6302 includes a resistor 6322 and an inductor 6324 connected in series between the input 686 and the cathode of the varicap 6302. The isolation network also includes a capacitor 6326 connected between the input 686 and ground and a resistor 6336 connected between circuit ground and the junction of the resistor 6322 with the inductor 6324.

In addition to the varicap 6302, the tuned circuit of the reference frequency voltage controlled oscillator 610 includes a variable capacitor 6342 connected between ground and the junction of the inductor 6324 with the cathode of the varicap 6302. An inductor 6344 and resistor 6346 are connected in series between the anode of the varicap 6302 and ground. A capacitor 6348 is connected to ground from the junction between the inductor 6344 and the resistor 6346. The connection of the anode of the varicap 6302 to the base of the transistor 6304 establishes a parallel resonant circuit at the base of the transistor 6304 consisting of the series connected capacitors of the varicap 6302 and the variable capacitor 6342 in parallel with the inductor 6344. Thus, a change in the capacitance of the varicap 6302 induced by a change in the voltage applied to the input 686 of the reference frequency voltage controlled oscillator 610 changes the resonant frequency of the tuned circuit located at the base of the transistor 6304.

The transistor 6304 is supplied with current via its collector. Current flows from the emitter of the transistor 6304 through a series connected inductor 6352, resistor 6354, and inductor 6356 to the negative supply voltage (−E) present on the line 3020. A capacitor 6358 connected between ground and the junction of the resistor 6354 with the inductor 6356 establishes a series resonant circuit in the collector of the transistor 6304. A resistor 6362 connected between the junction of the resistor 6354 with the inductor 6356 and the junction of the inductor 6344 with the resistor 6346 applies a direct current bias to the resonant circuit and isolation network coupled to the base of the transistor 6304 and also couples thereto a portion of the signal present in the resonant circuit located in the collector of the transistor 6304. A series connected capacitor 6372 and resistor 6374 couples the UHF radio transmission signal present at the emitter of the transistor 6304 to the output 58. A resistor 6376 is connected between ground and the terminal of the resistor 6374 at the output 58. Thus, the reference frequency voltage controlled oscillator 610 supplies a UHF reference signal from the output 58 of the UHF reference signal generator 60 through the resistor 6202 for transmission via the reference frequency signal transmission line 56 to the mixer 52.

In FIG. 7 is illustrated the low pass filter 78 of the UHF transmitter 20. The low pass filter 78 receives the sum and difference signals from the output 72 of the mixer 52 via the line 74. A resistor 7802 of the low pass filter 78 is connected between the input 76 and ground. The sum and difference signals present at the input 76 are coupled to the base of an NPN transistor 7806 via a series connected inductor 7812, resistor 7814, and coupling capacitor 7816. A capacitor 7818, connected between ground and the junction of the inductor 7812 with the resistor 7814, in conjunction with the inductor 7812 establishes a low pass filter which attenuates all frequency components in the sum and difference signals having frequencies higher than the frequency difference signal. The frequency difference signal present in the sum and difference signals is coupled through the resistor 7814 and capacitor 7816 to be further amplified by the transistor 7806.

Current is supplied to the collector of the transistor 7806 through a parallel network consisting of an inductor 7822 and a resistor 7824. Current flows from the emitter of the transistor 7806 through a resistor 7826 which is connected in series with an inductor 7828 and the negative supply voltage line 3020. To decrease the high frequency gain of the transistor 7806, a bypass capacitor 7832 is connected between the emitter and ground. A second bypass capacitor 7834, connected between ground and the junction of the resistor 7826 with the inductor 7828, impedes coupling of the frequency difference signal to the negative supply voltage line 3020 and its consequent imposition on the negative supply voltage (−E).

A voltage divider is provided by a resistor 7836 and a resistor 7838 connected in series between the negative supply voltage line 3020 and ground. The junction of the resistor 7836 with the resistor 7838 is connected to the base of an NPN transistor 7842 to provide a reference voltage thereto. Current flows from the transistor 7842 through a resistor 7844 connected between the emitter and the junction of the resistor 7826 with the inductor 7828. Thus, the transistor 7842 operates as an emitter follower increasing the power of the frequency difference signal which it receives through a coupling capacitor 7846 connected between its base and the junction of the inductor 7822 with resistor 7824 at the collector of the transistor 7806.

The amplification by the transistor 7806 followed by the further amplification by the emitter follower transistor 7842 produce a signal at the emitter of the transistor 7842 which is the amplified complement of the signal present at the base of the transistor 7806. Thus, a resistor 7852, connected between the emitter of the transistor 7842 and the base of the transistor 7806, provides a negative feedback signal which establishes a bias potential for the transistor 7806 and both reduces the overall gain of the low pass filter 78 and stabilizes the direct current voltage component in the signal present at the emitter of the transistor 7842. A feedback capacitor 7854, also connected between the emitter of the transistor 7842 and the base of the transistor 7806 in parallel with the resistor 7852, provides additional negative feedback of higher frequency components present in the signal at the emitter of the transistor 7842. Thus, the capacitor 7854 causes the amplifier consisting of the combined transistors 7806 and 7842 to operate as a low pass filter for further attenuating components in the sum and difference signals applied to the input 76 which are higher in frequency than the frequency difference signal. The low pass filter 78 transmits the amplified frequency difference signal present at the emitter of the transistor 7842 to the frequency difference signal output 80 through a resistor 7862 and a capacitor 7864 connected in series therebetween. At the frequency difference signal output 80, the frequency difference signal is transmitted from the low pass filter 78 via the line 82 to the input 84 of the phase detector 86.

Figures 8, 8A:
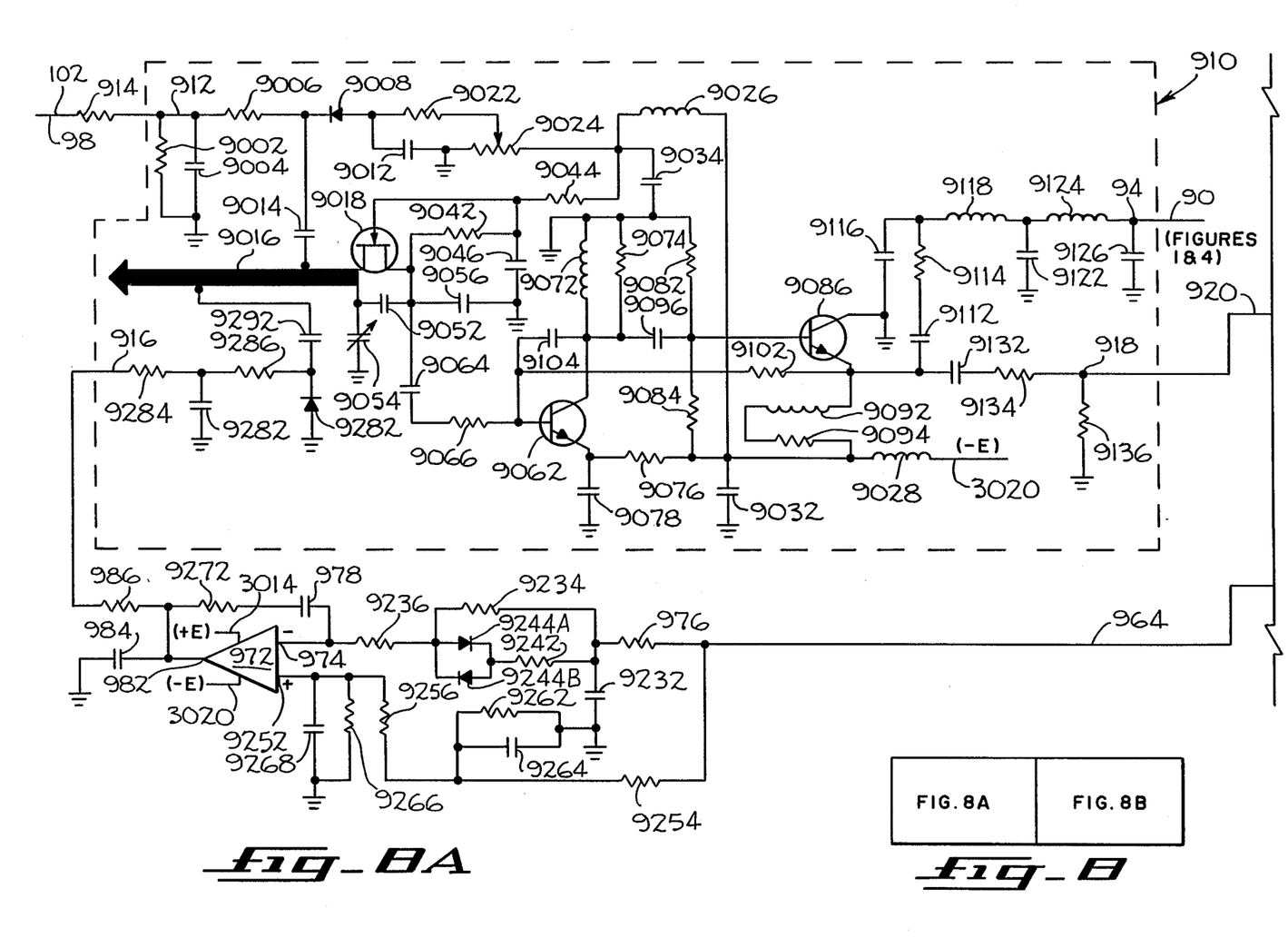
FIG. 8 illustrates a side-by-side placement of FIGS. 8A and 8B depicting a circuit diagram of the VHF signal generator shown in FIG. 4.
Figure 8B:
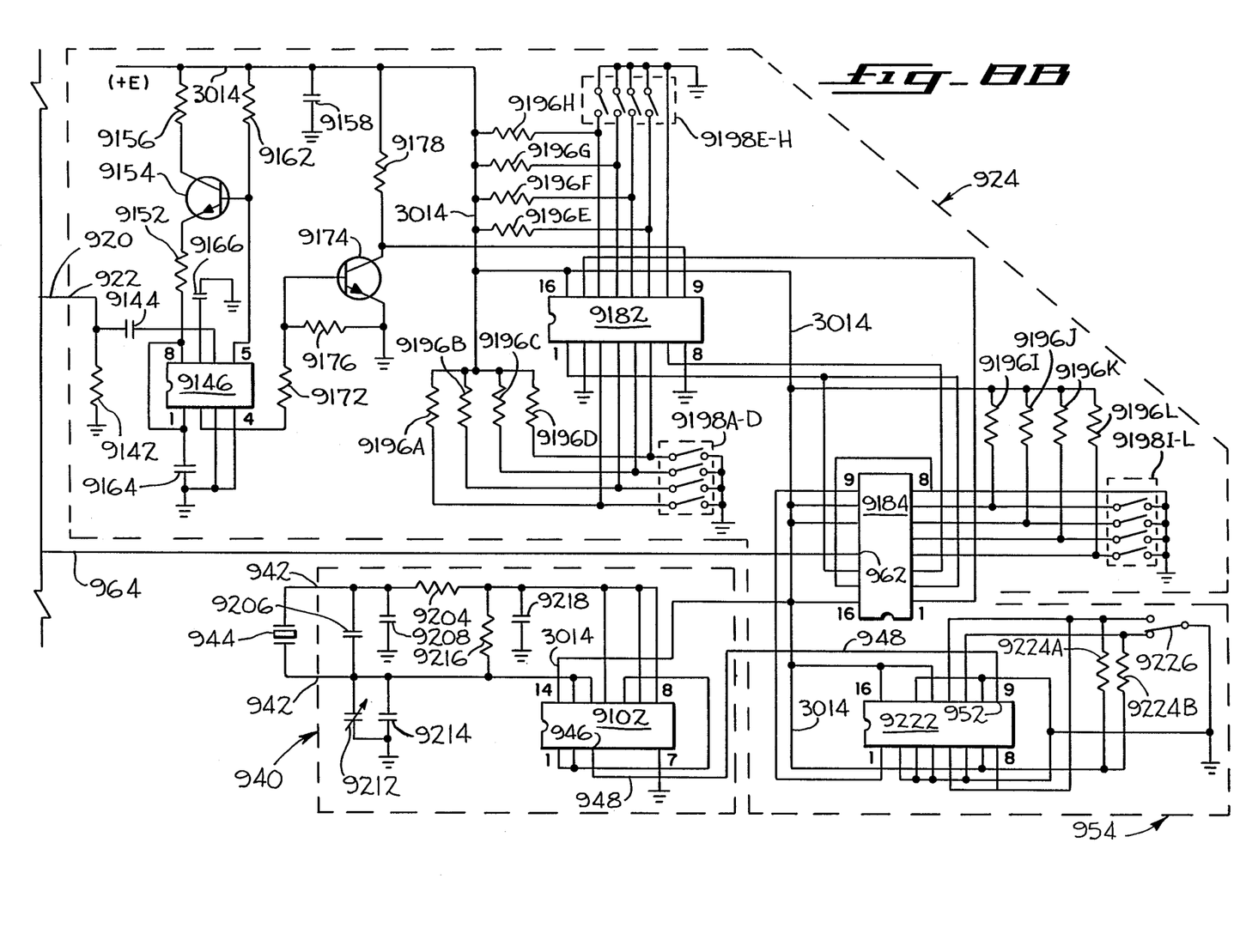

Illustrated in FIGS. 8A and 8B are programmable divider 924, phase comparator 932, crystal controlled oscillator 940, reference frequency divider 954, reference frequency error amplifier 972, and frequency modulation voltage controlled oscillator 910. The frequency modulation voltage controlled oscillator 910 receives the program signal. A parallel resistor 9002 and capacitor 9004 of the frequency modulation voltage controlled oscillator 910 are connected between ground and the input 912. A resistor 9006 is connected between the input 912 and the cathode of a varicap 9008 to apply a sample of the program signal thereto. A capacitor 9012 is connected between the anode of the varicap 9008 and ground. A capacitor 9014 is connected between the cathode of the varicap 9008 and an inductor 9016 depicted by the wide line and arrowhead in FIG. 8A. One end of the inductor 9016 is connected to the drain electrode of a common-gate field-effect transistor 9018. Thus, the series capacitances of the capacitor 9012, the varicap 9008, and the capacitor 9014 in combination with the inductance of the inductor 9016 establishes a resonant circuit located at the drain electrode of the field-effect transistor 9018. Applying the program signal to the varicap 9008 causes the total capacitance to change, thereby varying the resonant frequency of the resonant circuit at the drain electrode of the field-effect transistor 9018. Thus, the field-effect transistor 9018 provides a voltage controlled oscillator for generating the VHF radio signal.

A resistor 9022 connects the anode of the varicap 9008 to an adjustable potentiometer 9024. One end of the potentiometer 9024 is connected to ground and the other end is connected through a pair of series connected inductors 9026 and 9028 to the negative supply voltage ($-E$) present on the line 3020. A bypass capacitor 9032 is connected between ground and the junction of the inductor 9026 with the inductor 9028. Similarly, a bypass capacitor 9034 is connected between ground and the junction of the potentiometer 9024 with the inductor 9026. The use of an adjustable potentiometer 9024 facilitates applying a proper bias potential to the varicap 9008 through the resistor 9022. The bias potential is adjusted to establish the varicap 9008 in its linear operating range. The operation of the varicap 9008 in its linear range minimizes the program signal induced distortion in the VHF radio signal generated by the frequency modulation voltage controlled oscillator 910.

A pair of series connected resistors 9042 and 9044 are connected between the source electrode of the field-effect transistor 9018 and the junction of the inductor 9026 with the potentiometer 9024. The junction of the resistor 9042 with the resistor 9044 is connected to the gate electrode of the field-effect transistor 9018 to apply a bias potential thereto. A bypass capacitor 9046 is connected between ground and the junction of the resistor 9042 with the resistor 9044 to filter the bias voltage at the gate electrode of the field-effect transistor 9018. A feedback capacitor 9052 is connected between the inductor 9016 at its connection to the drain electrode of the field-effect transistor 9018 and to the resistor 9042 at its connection to the source electrode of the field-effect transistor 9018. An adjustable capacitor 9054 is connected between ground and the junction of the capacitor 9052 with the inductor 9016 at the drain electrode of the field-effect transistor 9018. Similarly, a capacitor 9056 is connected between ground and the junction of the capacitor 9052 with the resistor 9042 at the source electrode of the field-effect transistor 9018.

The VHF radio signal present at the source electrode of the field-effect transistor 9018 is applied to the base of an NPN transistor 9062 via a coupling capacitor 9064 and resistor 9066. Current is supplied to the transistor 9062 through a parallel network consisting of an inductor 9072 and a resistor 9074 both of which are connected between ground and the collector of the transistor 9062. Current flows out of the transistor 9062 from the emitter through a resistor 9076 connected in series with the inductor 9028 to the negative supply voltage ($-E$) present on the line 3020. To decrease the high frequency gain of the transistor 9062, a bypass capacitor 9078 is connected between the emitter and ground.

A voltage divider is provided by a resistor 9082 and a resistor 9084 connected in series between ground and the junction of the inductor 9028 with the resistor 9076. The junction of the resistor 9082 with the resistor 9084 is connected to the base of an NPN transistor 9086 to provide a reference voltage thereto. The transistor 9086 receives current at its collector which is connected directly to ground. Current flows out of the transistor 9086 through an inductor 9082 and a resistor 9094 connected in series between the emitter and the junction of the resistor 9076 with the inductor 9028. Thus, the transistor 9086 operates as an emitter follower increasing the power of the VHF radio signal.

The amplification by the transistor 9062 followed by the further amplification by the emitter follower transistor 9086 produces a signal at the emitter of the transistor 9086 which is the amplified complement of the signal present at the base of the transistor 9062. Thus, a resistor 9102, connected between the emitter of the transistor 9086 and the base of the transistor 9062, provides a negative feedback signal which establishes a bias potential for the transistor 9062 and both reduces the overall gain provided by the pair of amplifying transistors 9062 and 9086 and stabilizes the direct current voltage component in the signal present at the emitter of the transistor 9086. A feedback capacitor 9104, connected between the collector of the transistor 9062 and its base, provides additional negative feedback of higher frequency components present in the signal at the collector of the transistor 9062. Hence, the capacitor 9104 causes the amplifier consisting of the combined transistors 9062 and 9086 to operate as a low pass filter for attenuating higher frequency components in the VHF radio signal applied to the capacitor 9064.

A sample of the VHF radio signal present at the emitter of the transistor 9086 is coupled via an output filter network to the output 94 of the VHF radio signal generator 96. The input to the filter network consists of a capacitor 9112. One side of the capacitor 9112 is connected to the emitter of the transistor 9086. The other side of the capacitor 9112 is connected to one side of a resistor 9114. A capacitor 9116 is connected between ground and the other side of the resistor 9114. One side of an inductor 9118 is connected to the other side of the resistor 9114. Similarly, a capacitor 9122 is connected between ground and the other side of the inductor 9118. One side of an inductor 9124 is connected to the other side of the inductor 9118. Finally, a capacitor 9126 is connected between ground and the other side of the inductor 9124. The connection between the inductor 9124 and the capacitor 9126 constitutes the output 94 of the VHF radio signal generator 96 from which the VHF radio signal is transmitted via the line 90 to the phase detector 86.

The remainder of the VHF radio signal present at the emitter of the transistor 9086 is applied via a voltage divider network to the output 918 of the frequency modulation voltage controlled oscillator 910. The input of the voltage divider network is a capacitor 9132, one side of which is connected to the emitter of the transistor 9086. A pair of resistors 9134 and 9136 are connected in series between ground and the other side of the capacitor 9132. The junction between the resistors 9134 and 9136 is the output 918 of the frequency modulation voltage controlled oscillator 910 from which a sample of the VHF radio signal is transmitted via the line 920 to the input 922 of the signal divider 924.

The resistor 9142 of the signal divider 924 is connected between the input 922 and ground. A coupling capacitor 9144 is connected between the input 922 and an input pin 6 of a transistor-transistor-logic integrated circuit 9146 which is preferably a type SP8629 integrated circuit. Pins 1 and 8 of the integrated circuit 9146 are connected via a resistor 9152 to the emitter of an NPN transistor 9154. To supply current to the transistor 9154, a resistor 9156 is connected between the collector of the transistor 9154 and the positive supply voltage (+E) present on the positive supply voltage line 3014. A filter capacitor 9158 is connected between the positive supply voltage line 3014 and ground. A resistor 9162 is also connected from the positive supply voltage line 3014 to both the base of the transistor 9154 and pin 5 of the integrated circuit 9146.

Since the positive supply voltage (+E) is preferably greater than the +5 volt power customarily supplied to the transistor-transistor-logic integrated circuits, the connection of the resistor 9162 to pin 5 of the integrated circuit 9146 establishes a potential at the base of the transistor 9154 which causes it to apply a +5 volt potential to pins 1 and 8 of the integrated circuit 9146. A filter capacitor 9164 is connected between circuit ground and pin 1 of the integrated circuit 9146 to attenuate any alternating current signals appearing on the +5 volt potential applied thereto. A capacitor 9166 is connected between ground and pin 7 of the integrated circuit 9146 and its pins 3 and 4 are connected directly to ground. These various connections to the pins of the integrated circuit 9146 cause it to operate as a frequency divider for reducing the frequency of the VHF radio signal applied to pin 6 by a factor of one hundred.

The signal having a frequency reduced by a factor of one hundred from that of the VHF radio signal is transmitted from pin 2 of the integrated circuit 9146 to the base of an NPN transistor 9174 through a resistor 9172 connected therebetween. A pull-down resistor 9176 is connected between ground and the base of the transistor 9174. The resistor 9176 in conjunction with the resistor 9172 establishes a voltage divider for reducing the amplitude of the signal applied to the base of the transistor 9174 from that transmitted from pin 2 of the integrated circuit 9146. A resistor 9178 connected between the positive supply voltage line 3014 and the collector of the transistor 9174 supplies current to the transistor 9174. The emitter of the transistor 9174 is connected directly to ground. Thus, the transistor 9174 increases the amplitude of the reduced frequency signal received from pin 2 of the TTL integrated circuit 9146 to voltage levels which may be applied as an input signal to complementary metal-oxide-silicon ("CMOS") integrated circuits.

The collector of the transistor 9174 is connected directly to pin 9 of a CMOS integrated circuit 9182, which is preferably a type MC14569 integrated circuit, to apply the reduced frequency signal thereto. Pin 16 of the integrated circuit 9182 is connected to the positive supply voltage line 3014 while pins 2, 8 and 10 are connected to ground. Pin 1 of the integrated circuit 9182 is connected to both pins 2 and 14 of a CMOS integrated circuit 9184 which is preferably a type MC14568 integrated circuit. Pin 7 of the integrated circuit 9182 is connected to pin 3 of the integrated circuit 9184 and pin 15 of the integrated circuit 9182 is connected to pin 1 of the integrated circuit 9184. Pins 10, 11 and 16 of the integrated circuit 9184 are connected to the positive supply voltage line 3014 while pins 8 and 15 are connected to ground.

To control the operation of the integrated circuits 9182 and 9184 in response to the reduced frequency signal applied thereto from the transistor 9174, pins 3 through 6 and 11 through 14 of integrated circuit 9182 and pins 4 though 7 of integrated circuit 9184 are respectively connected to one side of resistors 9196A through 9196L. The other side of each of the resistors 9196A through 9196L is connected to the positive supply voltage (+E) present on the positive voltage supply line 3014. The respective junctions of the resistors 9196A through 9196L with the pins of the integrated circuits 9182 and 9184 are connected to contacts of single-pole, single-throw VHF signal control switches 9198A through 9198L. The other side of each of the VHF signal control switches 9198A through 9198L is connected to ground. Thus, the signal at each of the respective junctions between the resistors 9196A through 9196L and the pins of the integrated circuits 9182 and 9184 equals the ground potential when the respective VHF signal control switches 9198A through 9198L are closed. Conversely, a positive voltage signal is applied to the respective pins of the integrated circuits 9182 and 9184 when the respective VHF signal control switches 9198A through 9198L are open. The respective settings of the VHF signal control switches 9198A through 9198L establish the numerical value of a divisor by which the integrated circuits 9182 and 9184 divide the frequency of the reduced frequency signal received from the collector of the transistor 9174. Consequently, the numerical value of the first constant valued divisor by which the VHF radio signal is divided equals the numerical value of the divisor established by the settings of the VHF signal control switches 9198A through 9198L multiplied by the factor of one hundred (100).

The following table summarizes the numerical values of the divisors by which the combined integrated circuits 9182 and 9184 divide the reduced frequency signal received from the integrated circuit 9146 if a positive voltage signal is applied at only one junction between the respective pin of the integrated circuits 9182 and 9184 and the resistors 9196A through 9196L while the signal at all the remaining junctions equals the circuit ground potential:

| PIN AND RESISTOR JUNCTION | NUMERICAL VALUE OF THE DIVISOR IF A POSITIVE VOLTAGE SIGNAL IS PRESENT AT THE JUNCTION |
|---|---|
| 9182-3 & 9196A | 1 |
| 9182-4 & 9196B | 2 |
| 9182-5 & 9196C | 4 |
| 9182-6 & 9196D | 8 |
| 9182-11 & 9196E | 16 |
| 9182-12 & 9196F | 32 |
| 9182-13 & 9196G | 64 |
| 9182-14 & 9196H | 128 |
| 9184-7 & 9196I | 256 |
| 9184-6 & 9196J | 512 |
| 9184-5 & 9196K | 1024 |
| 9184-4 & 9196L | 2048 |

To determine the numerical value of the divisor by which the combined integrated circuits 9182 and 9184 will divide the frequency of the reduced frequency signal received from the collector of the transistor 9174 if a positive voltage signal is applied to more than one junction between the respective pins of the integrated circuits 9182 and 9184 and the very high frequency signal control switches 9198A through 9198L, merely sum the numbers in the preceding table associated with the respective junctions to which a positive voltage signal is applied. For example, if a desired value for the divisor is 1200, then a positive voltage signal would be applied to the junctions 9184-5 & 9196K (1024), 9182-14 & 9196H (128), 9182-12 & 9196F (32) and 9192-11 & 9196E (16) by opening the switches 9198K, 9198H, 9198F and 9198E. The signal at the remaining junctions would be set to the ground potential by closing the switches 9198A-D, 9198G, 9198I-J and 9198L.

Also included within the VHF radio signal generator 96 is the crystal controlled oscillator 940 for generating the reference frequency signal. To generate the frequency signal, the crystal controlled oscillator 940 includes a CMOS integrated circuit 9202 which is preferably a type MC14011 integrated circuit. Pin 14 of the integrated circuit 9202 is connected to the positive supply voltage line 3014 and pin 7 is connected to circuit ground. Pins 8, 9 and 11 of the integrated circuit 9202 are connected through a resistor 9204 to one of the reference frequency crystal inputs 924 of the crystal controlled oscillator 940 while pins 12 and 13 are connected directly to the other reference frequency crystal input 942. A capacitor 9206 is connected between the inputs 942 in parallel with the VHF reference crystal 944. A capacitor 9208 is connected between ground and the input 942 to which the resistor 9204 connects, and a variable capacitor 9212 and a capacitor 9214 are connected in parallel between ground and the other input 942. A resistor 9216 is connected between the junction of the group of pins 8, 9 and 11 of the integrated circuit 9202 with the resistor 9204 and the junction of the group of pins 12 and 13 with the variable capacitor 9212, capacitor 9214 and resistor 9216. A capacitor 9218 is connected between ground and the junction of the group of pins 8, 9 and 11 of the integrated circuit 9202 with the resistor 9204 and the resistor 9216. Pin 10 of the integrated circuit 9202 is connected directly to both pins 1 and 2. Pin 3 of the integrated circuit 9202, which is output 946 of the crystal controlled oscillator 940, transmits the reference frequency signal to the input 952 of the reference frequency divider 954 via the line 948. The preceding connections to the integrated circuit 9202 establish it as a crystal controlled oscillator for generating the 5.0 MHz reference frequency signal.

The frequency modulation reference frequency signal is applied to pin 9 of an integrated circuit 9222 which is preferably a type MC14569 integrated circuit. Pins 7, 13 and 16 of the integrated circuit 9222 are connected to the positive supply voltage line 3014. Pins 2, 3, 4, 6, 8, 10 and 14 of the integrated circuit 9222 are connected to ground. To control the operation of the integrated circuit 9222 in response to the frequency modulation reference frequency signal applied to pin 9 thereof, pins 5 and 12 are connected to one side of a resistor 9224A and pin 11 is connected to one side of a resistor 9224B. The other side of each of the resistors 9224A and 9224B is connected to the positive supply voltage (+E) present on line 3014. The respective junctions of the resistors 9224A and 9224B with the pins of the integrated circuit 9222 are connected to contacts of a single-pole, double-throw VHF signal control switch 9226. The other side of the VHF signal control switch 9226 is connected to ground. Hence, a positive voltage signal is always present at one of the respective junctions between the resistors 9224A and 9224B and the pins of the integrated circuit 9222 while the other junction equals the ground potential.

The setting of the VHF signal control switch 9226 establishes the numerical value of a divisor by which the integrated circuit 9222 divides the frequency of the frequency modulation reference frequency signal received from the frequency modulation crystal controlled oscillator 940. In particular, the numerical value of this divisor equals one hundred (100) if a positive voltage signal is applied to the junction between pins 5 and 12 of the integrated circuit 9222 and the resistor 9224A while the signal at the junction between pin 11 and the resistor 9224B equals the ground potential. Conversely, the numerical value of the divisor equals eighty (80) if a ground potential signal is applied to the junction between pins 5 and 12 of the integrated circuit 9222 and the resistor 9224A while a positive voltage signal is applied to the junction between pin 11 and the resistor 9224B.

The entire division of the frequency modulation reference frequency signal by the second constant divisor is not performed solely by the integrated circuit 9222. Rather, the remainder of this division is performed in a position of the integrated circuit 9184 which the reference frequency divider 954 occupies jointly with the VHF radio signal divider 924. Thus, pin 1 of the integrated circuit 9222 is connected to pin 9 of the integrated circuit 9184. Within the integrated circuit 9184, the signal received from the integrated circuit 9222 is divided by an additional factor of one hundred (100). Consequently, the second constant divisor has a numerical value of ten thousand if a division of the reference frequency signal by one hundred is performed in the integrated circuit 9222 or a value of eight thousand if a division by eighty is performed in the integrated circuit 9222. These pre-set numerical values for the second constant value divisor respectively reduce the 5.0 MHz reference frequency signal generated by the crystal controlled oscillator 940 to either the 500 or 625 Hz frequency of the integral reference sub-frequency signal. The 500 Hz integral reference sub-frequency signal is used if immediately adjacent UHF radio transmission signal transmitter frequencies are to be spaced 50 KHz apart or the 625 Hz integral reference sub-frequency signal is used if they are to be spaced 62.5 KHz apart.

As described previously in connection with FIG. 4, the output of the VHF radio signal divider 924 and the reference frequency divider 954 are respectively applied to the phase comparator 932. In the preferred embodiment of the UHF transmitter 20, the comparison of the integral sub-frequency signal produced by the VHF radio signal divider 924 with the integral reference sub-frequency signal produced by the reference frequency divider 954 to generate the frequency modulation control signal is performed within the integrated circuit 9184. Thus, the phase comparator 932 is totally contained within the integrated circuit 9184 jointly with a portion of both the VHF radio signal divider 924 and the frequency modulation reference frequency divider 954. The direct current control voltage generated by the integrated circuit 9184 is transmitted from pin 13, which is the control voltage output 962 of the phase comparator 932, to the reference frequency error amplifier 972 via the direct current control voltage line 964.

The frequency modulation control signal generated by the phase comparator 932 is transmitted via the direct current control voltage line 964 to one side of the resistor 976. The other side of the resistor 976 is connected through a capacitor 9232 to ground and by a network to the differential, inverting (−) input 974 of the reference frequency error amplifier 972 which is preferably one of a pair of amplifiers included in a single type LF353 integrated circuit. This network includes resistors 9234 and 9236 connected in series between the input resistance 976 and the inverting (−) input 974. A series connected resistor 9242 and pair of oppositely directed diodes 9244A and 9244B are connected in parallel with the resistor 9234. The overall network connected between the frequency modulation control signal line 964 and the inverting (−) input 974 of the reference frequency error amplifier 972 attenuates higher frequency components in the direct current control voltage present on the line 964 while simultaneously providing an increasing signal strength at the inverting (−) input 974 as the amplitude of the direct current control voltage increases.

In addition to the network connected between the direct current control voltage line 964 and input 974 of the reference frequency error amplifier 972, another network is connected between the direct current control voltage line 964 and a non-inverting (+) input 9252 of the reference frequency error amplifier 972. This network includes a resistor 9254 and resistor 9256 connected in series between the line 964 and the non-inverting (+) input 9252. A resistor 9262 and capacitor 9264 are connected in parallel between ground and the junction of the resistor 9254 with the resistor 9256. Similarly, a resistor 9266 and capacitor 9268 are connected in parallel between ground and the junction of the resistor 9256 with the non-inverting (+) input 9252 of the reference frequency error amplifier 972. Both the positive supply voltage (+E) present on the line 3014 and the negative supply voltage (-E) present on the line 3020 are also applied to the reference frequency error amplifier 972.

The amplification provided by the differential reference frequency error amplifier 972 produces a signal at the error amplifier output 982 of the reference frequency error amplifier 972 which is the amplified complement of the signal present at its inverting (−) input 974. A series connected resistor 9272 and the feedback capacitor 978 connected between the output 982 and the input 974 of the reference frequency error amplifier 972 provide a negative feedback signal of higher frequency components present in the signal at the output 982 of the reference frequency error amplifier 972. Thus, the reference frequency error amplifier 972 operates as a low pass filter providing lesser amplification for the higher frequency components in the frequency modulation control signal present on the line 964.

The amplified direct current control voltage present at the output 982 of the reference frequency error amplifier 972 is transmitted through the coupling resistor 986 to the input 916 of the frequency modulation voltage-controlled oscillator 910. The amplified direct current control voltage is applied to the cathode of a varicap 9282 through an isolation network connecting it with the input 916. This isolation network consists of a pair of resistors, resistor 9284 and resistor 9286, connected in series between the input 916 and the cathode of the varicap 9282 together with a capacitor 9288 connected between ground and the junction of the resistor 9284 with the resistor 9286. The anode of the varicap 9282 is connected to ground and a capacitor 9292 is connected between its anode and the inductor 9016. Thus, the amplified direct current control voltage applied to the input 916 of the frequency modulation voltage controlled oscillator 910 varies the overall series capacitance of the capacitor 9292 and the varicap 9282. This variation in the overall series capacitance of the capacitor 9292 and the varicap 9282 adjusts the center frequency of the resonant circuit located at the drain electrode of the field-effect transistor 9018 and thereby selects the VHF radio signal generated by the frequency modulation voltage controlled oscillator 910. The variable capacitor 9064 connected to the inductor 9016 at the drain electrode of the field-effect transistor 9018 is adjusted so the resonant circuit located in the drain electrode of the field-effect transistor 9018 is within the control range of the phase-locked loop of the VHF radio signal generator 96.

We claim:

1. An ultrahigh frequency transmitter for transmitting an ultrahigh radio frequency transmission signal frequency modulated by a program signal, said transmitter comprising:
   (a) a transmission frequency oscillator for generating an ultrahigh frequency transmission signal, said transmission frequency oscillator having a voltage input terminal for controlling the frequency of the ultrahigh frequency transmission signal generated by said transmission frequency oscillator;
   (b) an ultrahigh frequency reference frequency generator for generating an unmodulated ultrahigh frequency reference frequency signal;
   (c) mixing means for heterodyning a sample of said ultrahigh frequency transmission frequency signal and said unmodulated ultrahigh frequency reference frequency signal to produce an ultrahigh frequency difference signal;
   (d) a very high frequency generator for generating a very high frequency signal frequency modulated by the program signal; and
   (e) a phase detector receiving said ultrahigh frequency difference signal and said frequency modulated very high frequency signal for applying a voltage to said voltage input terminal of said transmission frequency oscillator for transmitting a stabilized ultrahigh frequency transmission signal frequency modulated by a program signal.

2. An ultrahigh frequency transmitter according to claim 1 wherein said ultrahigh frequency reference frequency generator, said mixing means, said phase detector, and said transmission frequency oscillator comprise a phase locked loop for stabilizing the ultrahigh frequency transmission frequency modulated by the program signal.

3. An ultrahigh frequency transmitter according to claim 2 wherein said ultrahigh frequency reference frequency generator includes a crystal controlled oscillator for producing a stabilized ultrahigh frequency reference frequency signal.

4. An ultrahigh frequency transmitter according to claim 2 wherein said phase locked loop includes a low pass filter for passing said ultrahigh frequency difference signal for application to said phase detector.

5. An ultrahigh frequency transmitter according to claim 1 wherein said very high frequency generator includes pre-settable very high frequency programmable frequency dividers to establish the frequency of the very high frequency signal.

6. An ultrahigh radio frequency transmitter for generating a frequency modulated ultrahigh frequency radio transmission signal comprising:
   a transmission frequency oscillator for generating an ultrahigh frequency radio transmission signal, said transmission frequency oscillator including an input to which a transmission frequency control voltage is applied for controlling the frequency of said ultrahigh frequency radio transmission signal generated by said transmission frequency oscillator; and
   transmission oscillator stabilizing means connected to said input of said transmission frequency oscillator for stabilizing the frequency of said ultrahigh frequency radio transmission signal generated by said transmission frequency oscillator; and
   frequency modulation signal generating means for producing a very high frequency signal modulated by a program signal for applying through said transmission oscillator stabilizing means a voltage derived from said program signal to the input terminal of said transmission frequency oscillator,
   said transmission oscillator stabilizing means comprising:
   ultrahigh reference frequency signal generating means for generating a stable unmodulated ultrahigh reference frequency signal;
   a mixer for heterodyning a sample of said ultrahigh frequency radio transmission signal with said stable ultrahigh reference frequency signal, whereby sum and difference signals are generated including a frequency difference signal having a frequency equal to the difference between that of the ultrahigh frequency radio transmission signal and the frequency of said ultrahigh reference frequency signal;
   low pass filter means having an input to which said sum and difference signals are applied for passing said frequency difference signal; and
   a phase detector for receiving said frequency difference signal passed by said low pass filter and said frequency modulated very high frequency signal produced by said frequency modulation signal generating means to apply to said input of said transmission frequency oscillator a voltage for simultaneously stabilizing and frequency modulating said ultrahigh frequency ratio transmission oscillator.

7. The ultrahigh radio frequency transmitter according to claim 6 wherein said phase detector receives said frequency difference signal and a program modulated signal to produce the transmission frequency control voltage for simultaneously stabilizing and frequency modulating said ultrahigh frequency radio transmission signal by applying the transmission frequency control voltage to the transmission frequency control voltage input of said transmission frequency oscillator means.

8. An ultrahigh radio frequency transmitter for generating a frequency modulated frequency radio transmission signal comprising:
   a transmission frequency oscillator for generating an ultrahigh frequency radio transmission signal, said transmission frequency oscillator including an input to which a transmission frequency control voltage is applied for controlling the frequency of said ultrahigh frequency radio transmission signal generated by said transmission frequency oscillator;
   transmission oscillator stabilizing means connected to said input of said transmission frequency oscillator for stabilizing the frequency of said ultrahigh frequency radio transmission signal generated by said transmission frequency oscillator; and
   frequency modulation signal generating means for producing a very high frequency signal frequency modulated by a program signal for applying through said transmission oscillator stabilizing means a voltage derived from said program signal to the input terminal of said transmission frequency oscillator,
   said terminal oscillator stabilizing means comprising:
   ultrahigh reference frequency signal generating means for generating a stable ultrahigh reference frequency signal;

a mixer for heterodyning a sample of said ultrahigh frequency radio transmission signal with said stable ultrahigh reference frequency signal, whereby sum and difference signals are generated including a frequency difference signal having a frequency equal to the difference between that of the ultrahigh frequency radio transmission signal and the frequency of said ultrahigh reference frequency signal;

low pass filter means having an input to which said sum and difference signals are applied for passing said frequency difference signal; and a phase detector for receiving said frequency difference signal passed by said low pass filter and said frequency modulated very high frequency signal produced by said frequency modulation signal generating means to apply to said input of said transmission frequency oscillator a voltage for simultaneously stabilizing and frequency modulating said ultrahigh frequency radio transmission oscillator, said ultrahigh reference frequency signal generating means comprising:

reference frequency crystal controlled oscillator means for generating a sub-harmonic frequency reference signal of said ultrahigh reference frequency signal;

harmonic generating means for generating the frequency of said sub-harmonic frequency reference signal to produce crystal controlled ultrahigh reference frequency signals having one of the harmonic frequencies equal to the ultrahigh reference frequency signal;

reference frequency phase detector means having a first input to which said crystal controlled ultrahigh reference frequency signal is applied; and reference frequency oscillator means for generating said stable ultrahigh reference frequency signal, said reference frequency oscillator means including a reference frequency control voltage input to which a reference frequency control voltage is applied for controlling the frequency of said ultrahigh reference frequency signal, a sample of said ultrahigh reference frequency signal generated by said reference frequency oscillator means being applied to a second input of said reference frequency phase detector means for generating the reference frequency control voltage which is proportional to the phase difference between said crystal controlled ultrahigh reference frequency signal and said ultrahigh frequency reference signal, the reference frequency control voltage generated by said reference frequency phase detector means being applied to said reference frequency control voltage input of said reference frequency oscillator means for selecting the frequency of said ultrahigh reference frequency signal.

9. An ultrahigh radio frequency transmitter for generating a frequency modulated ultrahigh frequency radio transmission signal comprising:

a transmission frequency oscillator for generating an ultrahigh frequency radio transmission signal, said transmission frequency oscillator including an input to which a transmission frequency control voltage is applied for controlling the frequency of said ultrahigh frequency radio transmission signal generated by said transmission frequency oscillator;

transmission oscillator stabilizing means connected to said input of said transmission frequency oscillator for stabilizing the frequency of said ultrahigh frequency radio transmission signal generated by said transmission frequency oscillator; and frequency modulation signal generating means for producing a very high frequency signal, frequency modulated by a program signal for applying through said transmission oscillator stabilizing means a voltage derived from said program signal to the input terminal of said transmission frequency oscillator, said frequency modulation signal generating means comprising:

frequency modulation oscillator means for generating said frequency modulated very high frequency radio signal, the frequency generated by said frequency modulation oscillator means being controllable by a control voltage applied to control voltage input thereof, said frequency modulation oscillator means further including an input to which said program signal is applied for frequency modulating said very high frequency radio signal;

very high frequency signal divider means to which is applied a sample of said very high frequency radio signal for reducing the frequency of said very high frequency radio signal to an integral sub-frequency signal thereof by dividing said very high frequency radio signal by a chain of variable frequency divisors;

phase comparator means having a first input to which said integral sub-frequency signal is applied;

crystal controlled oscillator means for generating a frequency modulation reference frequency signal; and reference frequency divider means to which is applied said reference frequency signal for reducing the frequency of said frequency modulation reference frequency signal to an integral sub-frequency signal, said integral reference sub-frequency beig applied to a second input of said phase comparator means, said phase comparator means generating the control voltage which is proportional to the phase difference between said integral sub-frequency signal and said integral reference sub-frequency signal, said control voltage being applied to the control voltage input of said frequency modulation oscillator means for stabilizing the frequency of said very high frequency radio oscillator.

10. An ultrahigh radio frequency transmitter according to claim 9 and further comprising very high frequency signal control switch means connected to said very high frequency signal divider means and said reference frequency divider means to establish the respective numerical values for reducing the frequency of said very high frequency radio signal to the frequency of said integral sub-frequency signal and reducing the frequency of said frequency modulation reference frequency signal to the frequency of said integral reference sub-frequency signal, whereby the receiving of said frequency modulated very high frequency radio signal and said frequency difference signal generates the transmission frequency control voltage for simultaneously stabilizing and frequency modulating said ultrahigh frequency radio transmission signal.

11. The method of generating an ultrahigh frequency radio transmission signal frequency modulated by a program signal comprising the steps of:

generating an ultrahigh frequency radio transmission signal by means of a transmission frequency oscillator, the transmission frequency of said transmission frequency oscillator being controllable by a voltage applied to a transmission frequency control voltage input thereof;

generating a program modulated signal;

stabilizing the frequency of said ultrahigh frequency radio transmission signal generated by said transmission frequency oscillator; and frequency modulating said ultrahigh frequency radio transmission signal by applying a voltage derived from said program modulated signal to the transmission frequency control voltage input of said transmission frequency oscillator, said ultrahigh frequency radio transmision signal is stabilized by the steps of:

generating a frequency stable unmodulated ultrahigh frequency reference signal;

heterodyning a sample of said ultrahigh frequency radio transmission signal with said stable unmodulated ultrahigh frequency reference signal whereby sum and difference signals are generated including a frequency difference signal having a frequency equal to the difference between that of the ultrahigh frequency radio transmission signal and the frequency of unmodulated ultrahigh reference frequency signal;

applying said sum and difference signals to an input of a low pass filter which passes said frequency difference signal; and combining said frequency difference signal with a signal derived from said program modulated signal to apply a transmission frequency control voltage to said transmission frequency control voltage input of said transmission frequency oscillator for stabilizing the frequency of said ultrahigh frequency radio transmission oscillator while simultaneously frequency modulating it with said program modulated signal.

12. The method according to claim 11 wherein said frequency difference signal is received with a signal derived from said program modulated signal to produce the transmission frequency control voltage for controlling the frequency of said ultrahigh frequency radio transmission signal by the steps of:

applying said frequency difference signal to a first input of a phase detector;

generating a very high frequency radio signal which is frequency modulated by said program signal to be transmitted; and applying said frequency modulated very high frequency radio signal to a second input of said phase detector for generating the transmission frequency control voltage proportional to the phase difference between said frequency difference signal and said program modulated very high frequency radio signal, the transmission frequency control voltage being applied to the transmission frequency control voltage input of said transmission frequency oscillator for stabilizing the frequency of said ultrahigh frequency radio transmission signal while simultaneously frequency modulating said ultrahigh frequency radio transmission signal with said signal.

13. A method of generating an ultrahigh frequency radio transmission signal frequency modulated by a program signal comprising the steps of:

generating an ultrahigh frequency radio transmission signal by means of a transmission frequency oscillator, the transmission frequency of said transmission frequency oscillator being controllable by a voltage applied to a transmission frequency control voltage input thereof;

generating a program modulated signal;

stabilizing the frequency of said ultrahigh frequency radio transmission signal generated by said transmission frequency oscillator; and frequency modulating said ultrahigh frequency radio transmission signal by applying a voltage derived from said program modulated signal to the transmission frequency control voltage input of said transmission frequency oscillator, said ultrahigh frequency radio transmission signal being stabilized by the steps of:

generating a frequency stable ultrahigh frequency reference signal;

heterodyning a sample of said ultrahigh frequency radio transmission signal with said stable ultrahigh frequency reference signal, whereby sum and difference signals are generated including a frequency difference signal having a frequency equal to the difference between that of the ultrahigh frequency radio transmission signal and the frequency of ultrahigh reference frequency signal;

applying said sum and difference signals to an input of a low pass filter which passes said frequency difference signal; and combining said frequency difference signal with a signal derived from said program modulated signal to apply a transmission frequency control voltage to said transmission frequency control voltage input of said transmission frequency oscillator for stabilizing the frequency of said ultrahigh frequency radio transmission oscillator while simultaneously frequency modulating it with said program modulated signal, said frequency stable ultrahigh reference frequency signal being generated by the steps of:

generating a sub-harmonic reference frequency signal of said ultrahigh frequency refernece signal with a reference frequency crystal controlled oscillator;

generating harmonics of said sub-harmonic reference frequency signal to produce crystal controlled ultrahigh frequency reference signals having one of the harmonics equal to said ultrahigh frequency reference signal;

applying said crystal controlled ultrahigh frequency reference signal to a first input of a reference frequency phase comparator;

generating said stable ultrahigh reference frequency signal by means of a reference frequency oscillator whose output frequency is controllable by a reference frequency control voltage applied to a reference control voltage input thereof; and applying a sample of said ultrahigh frequency reference signal to a second input of said reference frequency phase comparator, said reference frequency phase comparator generating the reference frequency control voltage which is proportional to the phase difference between one of the harmonic frequencies of said crystal controlled reference oscillator and said ultrahigh frequency reference signal, the reference frequency control voltage being applied to said reference frequency control voltage input of said reference frequency oscillator for urging the frequency of said ultrahigh frequency reference signal generated by said reference frequency oscillator to be equal to the frequency of one of the harmonics of said crystal controlled oscillator.

* * * * *